United States Patent
Matsubara

(10) Patent No.: US 11,367,587 B2
(45) Date of Patent: Jun. 21, 2022

(54) GAS FIELD IONIZATION SOURCE

(71) Applicant: Hitachi, Ltd., Tokyo (JP)

(72) Inventor: Shinichi Matsubara, Tokyo (JP)

(73) Assignee: HITACHI, LTD., Tokyo (JP)

( * ) Notice: Subject to any disclaimer, the term of this patent is extended or adjusted under 35 U.S.C. 154(b) by 274 days.

(21) Appl. No.: 16/812,649

(22) Filed: Mar. 9, 2020

(65) Prior Publication Data

US 2020/0365360 A1 Nov. 19, 2020

(30) Foreign Application Priority Data

May 14, 2019 (JP) .............................. JP2019-091313

(51) Int. Cl.
*H01J 7/24* (2006.01)
*H01J 1/46* (2006.01)

(52) U.S. Cl.
CPC . *H01J 7/24* (2013.01); *H01J 1/46* (2013.01)

(58) Field of Classification Search
CPC ...... H01J 7/24; H01J 1/46; H01J 37/28; H01J 2237/0807; H01J 37/08; H01J 27/26; H01J 2237/002
See application file for complete search history.

(56) References Cited

U.S. PATENT DOCUMENTS

| 8,101,922 | B2 * | 1/2012 | Winkler | H01J 27/26 313/231.01 |
| 2009/0020708 | A1 * | 1/2009 | Winkler | H01J 27/26 250/424 |
| 2011/0147609 | A1 * | 6/2011 | Shichi | H01J 37/067 250/398 |
| 2011/0266465 | A1 * | 11/2011 | Shichi | H01J 37/08 250/492.3 |
| 2015/0008342 | A1 * | 1/2015 | Notte, IV | H01J 37/08 250/493.1 |
| 2017/0229284 | A1 * | 8/2017 | Matsubara | H01J 37/08 |
| 2017/0352517 | A1 * | 12/2017 | Shichi | H01J 37/28 |
| 2018/0025888 | A1 * | 1/2018 | Shichi | H01J 37/241 250/307 |
| 2020/0365360 | A1 * | 11/2020 | Matsubara | H01J 37/28 |

FOREIGN PATENT DOCUMENTS

| JP | 2009059628 A | * | 3/2009 |
| JP | 2013008471 A | | 1/2013 |
| JP | 2016076431 A | | 5/2016 |

OTHER PUBLICATIONS

Office Action dated Dec. 23, 2021 in German Application No. 102020109610.0.

* cited by examiner

*Primary Examiner* — David A Vanore
(74) *Attorney, Agent, or Firm* — Miles & Stockbridge P.C.

(57) ABSTRACT

A gas field ionization source for forming an electric field for ionizing gas comprises: an emitter tip having a tip end; an extraction electrode facing the emitter tip and having an aperture at a position distant therefrom; a gas supply means for supplying the gas in the vicinity of the emitter tip; a vacuum partition made of a metal having a hole; and a high voltage power source for applying voltage between the emitter tip and the extraction electrode. The hole is constructed so that the tip end of the emitter tip can pass therethrough and the vacuum partition has a micro protrusion, around the hole, protruding toward a side of the extraction electrode.

10 Claims, 5 Drawing Sheets

Confirmation on effect according to an embodiment (Ion current detection by micro channel plate)

GAS FIELD IONIZATION SOURCE

CROSS REFERENCE TO RELATED APPLICATIONS

The present application claims priority from Japanese patent application JP 2019-091313 filed on May 14, 2019, the entire content of which is hereby incorporated by reference into this application.

BACKGROUND

Technical Field

The present invention relates to a gas field ionization source.

Structure of a surface of a sample can be observed by converging an electron beam via an electromagnetic field lens, irradiating this for scanning on the sample and detecting secondary electrons/charged particles emitted from the sample. This is called a Scanning Electron Microscope. On the other hand, the structure of the surface of the sample can also be observed by converging an ion beam via an electromagnetic field lens, irradiating this for scanning on the sample and detecting secondary charged particles emitted from the sample. This is called a Scanning Ion Microscope (SIM hereinafter).

One type of ion sources used for the SIM is a Gas Field Ionization Source (hereinafter this may referred to as GFIS). A GFIS applies a high voltage to a metal emitter tip, preferably the radius of curvature in its tip is equal to or less than about 100 nm, focuses electric field to the tip, introduces gas (ionization gas) around the tip, ionizes the gas molecules by the electric field and extracts an ion beam. Hereinafter, the gas is referred to as "ionization gas" including the gas before being ionized, and this does not always mean "gas including ions" or "ionized gas".

In a SIM using a GFIS (hereinafter GFIS-SIM), apparatuses using helium ion beam or neon beam are mainstream. This is because an ion beam emitted from a GFIS has a narrower energy band and smaller light source size compared with a liquid-metal ion source or an ion source utilizing plasma phenomenon so that the beam can be converged to a smaller size.

BACKGROUND ART

JP 2016-76431A discloses a construction example comprising a container filled with material gas, a needle-shaped electrode arranged within the container and a micro aperture provided at an outer wall of the container wherein a pressure inside the container is higher than the outside, the material gas is ejected from inside the container to outside through the micro aperture, around the micro aperture is an aperture electrode, the needle-shaped electrode and the aperture electrode are in the same electric potential, the material gas is ionized by electric field ionization by applying a strong electric field at the tip of the needle-shaped electrode by the electric potential difference between the needle-shaped electrode and the aperture electrode and an external electrode arranged at the outside of the container, and extracts the ions.

JP 2013-8471A discloses an example of gas ion source which generates an ion beam by applying a voltage between an electric field ionization electrode and an external electrode so that electric field is formed in the vicinity of the tip of the electric field ionization electrode and electric-field ionizing material gas ejected from a micro aperture of an ion source container, wherein a portion of a surface of the ion source container, a portion or an entire portion of a surface of the external electrode or an entire portion of the external electrode located in a region in the vicinity of the tip of the electric field ionization electrode is constructed by a thin film of a second electron emission suppressing material.

SUMMARY

However, conventional techniques have a problem that the emitter tip has to be cooled to a low temperature in order to maintain a sufficient ion beam intensity.

Temperatures required for cooling differ depending on the ions to be used, but generally, gases having lower condensation temperatures (e.g. hydrogen or helium) require lower cooling temperatures for maintaining a sufficient intensity. For cooling of the emitter tip, there are a method using a coolant such as liquid nitrogen or liquid helium and a method using a mechanical refrigerator e.g. of Gifford-McMahon type.

The method using coolant requires a high running cost and user's labor for supplying the coolant. On the other hand, the method using the mechanical refrigerator requires a high initial cost. Also, in the both methods, the emitter tip vibrates upon cooling operation, which leads to deterioration of a quality of a scanned ion image or accuracy upon working by the ion beam.

The invention provides a gas field ionization source wherein the emitter tip does not have to be cooled or is operable with a weaker cooling.

A gas field ionization source related to the present invention is a gas field ionization source for forming an electric field for ionizing gas, comprising:
- an emitter tip having a tip end;
- an extraction electrode facing the emitter tip and having an aperture at a position distant therefrom;
- a gas supplier for supplying the gas in the vicinity of the emitter tip;
- a vacuum partition made of a metal having a hole, the hole being constructed so that the tip end of the emitter tip can pass therethrough; and
- voltage applier for applying voltage between the emitter tip and the extraction electrode,
- wherein the vacuum partition has a convex structure, around the hole, protruding toward a side of the extraction electrode.

According to a gas field ionization source related to the present invention, the emitter tip does not have to be cooled or can be operable with a weaker cooling.

Thus, for example, a gas field ionization source in a GFIS-SIM can be operated without using any coolant or mechanical refrigerator. An exemplary effect is that the initial introduction cost and the running cost of an apparatus can be reduced.

DETAILED DESCRIPTION

Figure 1:
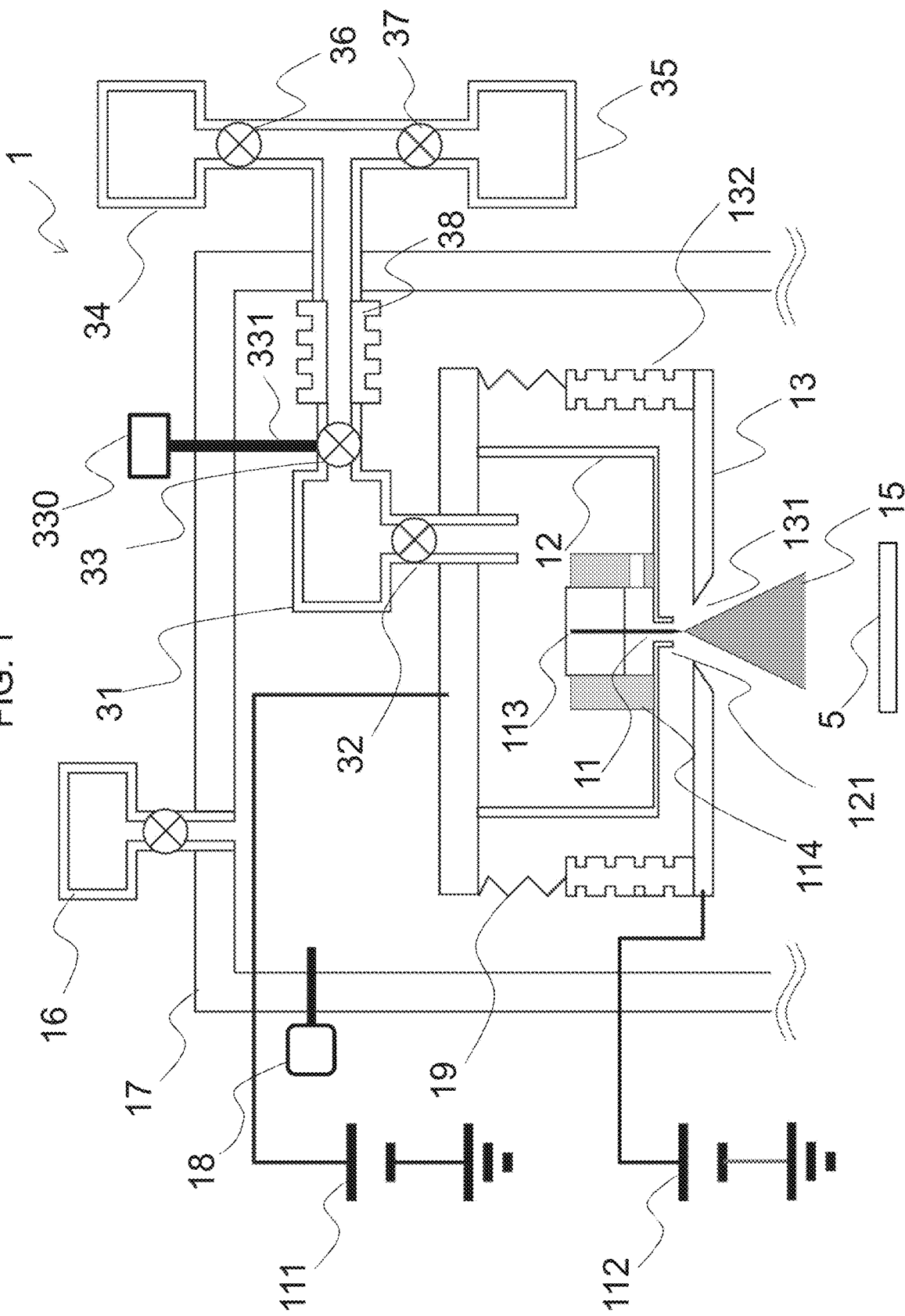
FIG. 1 is a diagram showing a construction of a gas field ionization source related to a first embodiment of the present invention.

The inventor studied a technique for improving an intensity of the gas field ionization source to a practical level without using any means for cooling the emitter tip.

In an embodiment, a vacuum partition is provided between the emitter tip and an extraction electrode, a hole is provided at the vacuum partition for projecting a tip end of the emitter tip toward the side of the extraction electrode, ionization gas is supplied from the side of a base of the emitter tip, and the ionization gas is evacuated from the extraction electrode side, so that a gas pressure is raised in the vicinity of the tip end of the emitter tip.

In an embodiment, the electric field for ionizing the ionization gas around the tip end of the emitter tip can be generated without applying a large electric potential difference (e.g. of equal to or more than 30 kV) between the emitter tip and the extraction electrode by employing a convex structure wherein the hole is slightly elevated around the side of extraction electrode.

In an embodiment, the gas pressure of the ionization gas supplied to the side of the emitter tip can be raised without a risk of electric discharge by equalizing an electric potential of an ionization gas supply means (e.g. a gas cylinder) with an electric potential of the emitter tip.

In an embodiment, a balance can be adjusted between the electric field generated in the vicinity of the tip end of the emitter tip and the pressure of the ionization gas supplied around the emitter tip by providing a mechanism for adjusting a relative position between the emitter tip and the extraction electrode.

The present invention will be explained below in accordance with embodiments referring to the drawings. However, the present invention can be implemented in any construction other than the embodiments described below within a range not departing from ideas of the present invention defined in the appended claims.

First Embodiment

A gas field ionization source related to a first embodiment of the present invention will be described referring to FIGS. 1, 2, 3, 4 and 5.

A gas field ionization source 1 comprises an emitter tip 11 (also referred to as an emitter electrode), an extraction electrode 13, a vacuum chamber 17 (vacuum container), an evacuation means 16, a gas cylinder 35, high voltage power sources 111 and 112 and a micro channel plate 5, and forms an electric field for ionizing a gas (ionization gas).

The emitter tip 11 has a tip end. The tip end means, for example, an end at the side of the extraction electrode 13. The tip end is preferably formed in a shape that can generate a strong electric field within a small range, and for example of a shape described as "needle-shaped". The extraction electrode 13 has an extraction electrode hole 131 (aperture). The extraction electrode hole 131 is provided distant from the emitter tip 11 (precisely, the tip end thereof) and facing this.

The vacuum chamber 17 contains the emitter tip 11 and the extraction electrode 13. The evacuation means 16 is connected to the vacuum chamber 17. The gas cylinder 35 supplies the ionization gas to an inside of the vacuum chamber 17.

The high voltage power source 111 applies a voltage between the emitter tip 11 and a ground potential. In order for this, an electrically conductive member (not shown) may be placed between the high voltage power source 111 and the emitter tip 11. Also, the high voltage power source 112 applies a voltage between the extraction electrode 13 and the ground potential. Thus, the high voltage power sources 111 and 112 act as means for applying a voltage between the emitter tip 11 and the extraction electrode 13, thereby forming an electric field for ionizing (e.g. into positive ions) a gas in the vicinity of the tip end of the emitter tip 11.

The high voltage power sources 111 and 112 may be constructed so that the electric potentials of emitter tip 11 and the extraction electrode 13 are independently controllable. This allows controlling voltages for accelerating an ion beam, forming the electric field and extraction. However, it is possible to use only one of the high voltage power sources 111 and 112 so that the other is omitted (in that case, the omitted side may be always at the ground potential).

The gas field ionization source 1 first applies a high voltage between the emitter tip 11 and the extraction electrode 13 in order to emit an ion beam 15 from the emitter tip 11. The application of the high voltage focuses a strong electric field in the vicinity of the tip end of the emitter tip 11. The strength of the electric field formed in the vicinity of the tip end is controlled to strength sufficient for ionizing the ionization gas (e.g. ionizing hydrogen gas into positive ions). At this state, using the gas cylinder 35 to introduce the ionization gas into the vacuum chamber 17 (in particular, in the vicinity of the emitter tip 11) emits an ion beam from the tip end of the emitter tip 11.

The ion beam 15 strikes a sample to be observed and secondary electrons or secondary charged particles are emitted from the sample. The emitted secondary electrons or secondary charged particles are detected at the micro channel plate 5.

An insulator 132 may be placed between the emitter tip 11 (or a portion electrically connected to the emitter tip 11) and the extraction electrode 13 (or a portion electrically connected to the extraction electrode 13). In this way, a higher voltage can be applied between the emitter tip 11 and the extraction electrode 13.

Also, a movable member (e.g. bellows 19) may be placed between the emitter tip 11 (or a portion electrically connected to the emitter tip 11) and the extraction electrode 13 (or a portion electrically connected to the extraction electrode 13). In this way, a positional relationship between the emitter tip 11 and the extraction electrode 13 can be adjusted. The movable member is constructed so that, for example, a distance between the tip end of the emitter tip 11 and the extraction electrode hole 131.

Further, the gas field ionization source 1 may be constructed so that various ionization gases can be introduced in the vicinity of the emitter tip 11. For example, not only the single gas cylinder 35 but also another gas cylinder may be comprised. Also, if a plurality of gas cylinders are used, the gas cylinders may supply respectively different types of ionization gas. As types of the ionization gas, for example, helium, neon, argon, krypton, xenon, nitrogen, oxygen, hydrogen, etc. can be used.

It is constructed that the ionization gas is first supplied from the gas cylinder 35 to a gas supply means 31 via a flow rate adjusting means 37, an insulation tube 38 and a valve 33. The gas supply means 31 may be a metal (or electrically conductive) airtight container. The gas supply means 31 may be a gas cylinder. The gas supply means 31 supplies the ionization gas in the vicinity of the emitter tip 11 (in particular, in the vicinity of the tip end of the emitter tip 11).

Here, the gas cylinder 35 can be considered to be an additional gas supply means for supplying gas to the gas supply means 31. An insulation tube 38 connects the gas supply means 31 and the gas cylinder 35 as an insulating pipe. Because of this construction, the gas supply means 31 and the gas cylinder 35 are in fluid communication indirectly while being electrically insulated.

Also, after the ionization gas is supplied from the gas cylinder 35 to the gas supply means 31, the ionization gas residing within a flow path (including the insulation tube 38) may be evacuated. For example, after closing the valve 33 and the flow rate adjusting means 37, a valve 36 may be opened and the ionization gas between the valve 33 and the flow rate adjusting means 37 may be evacuated by the vacuum pump 34. Thus the vacuum pump 34 evacuates the inside of the insulation tube 38.

The ionization gas can be prevented from electric discharge by thus evacuating the flow path. In particular, the inside of the insulation tube 38 is evacuated, so the path of electrical discharge can be eliminated entirely.

The gas supply means 31 is contained in the vacuum chamber 17, in a manner similar to the emitter tip 11. The gas field ionization source 1 may comprise an emitter tip supporting component 113, an emitter tip positioning component 114, a vacuum partition 12 and a flow rate adjusting means 32. The vacuum partition 12 is contained in the vacuum chamber 17.

The emitter tip supporting component 113, the emitter tip positioning component 114, the vacuum partition 12, the flow rate adjusting means 32 and the gas supply means 31 may all be constructed from metal (or electrically conductive) members or materials and they all may be electrically connected. In this way, electric potentials of all these constructional elements will be equal to an electric potential present at the emitter tip 11 by the high voltage power source 111. That is, the gas supply means 31 is electrically connected to the emitter tip 11 or has the electrical potential equal to the emitter tip 11.

Further, in that case, the insulation tube 38 may be placed between these constructional elements (e.g. the gas supply means 31) and the vacuum chamber 17 so that they are electrically insulated. According to such a construction, the emitter tip 11 and the gas supply means 31 will have an equal electric potential, so there will be no risk of electric discharge of the gas between the emitter tip 11 and the gas supply means in principle even if the ionization gas is present therebetween at a high gas pressure. That is, the pressure of the ionization gas introduced around the emitter tip 11 can be higher, allowing a greater electric current for the ion beam 15.

Also, in a case wherein the flow rate adjusting means 32 and the valve 33 are contained in the vacuum chamber 17 as the present embodiment, an adjusting mechanism for controlling the flow rate adjusting means 32 and the valve 33 may be provided outside of the vacuum chamber 17. For example, an atmosphere-side adjusting mechanism 330 is provided and connected to the valve 33 (or the flow rate adjusting means 32) by a connection mechanism 331. The connection mechanism 331 may be a power transmission mechanism or an information transmission means. If the connection mechanism 331 is a power transmission mechanism, it can be constructed by an electrically insulating member. If the connection mechanism 331 is an information transmission means, it can be constructed to communicate an instruction issued from the atmosphere-side adjusting mechanism 330 to the valve 33 (or the flow rate adjusting means 32) in a remote manner by using an electric wave or the like.

In the present embodiment, an electrical current of the ion beam 15 is increased by introducing the ionization gas at a high gas pressure in the vicinity of the emitter tip 11. Here, generally, in a gas field ionization source, as the gas pressure gets higher, the degradation in convergence performance of the ion beam 15 gets greater due to collision between the ion beam 15 and gas molecules.

A ratio of the ion beam 15 being scattered increases as the gas pressure rises. This ratio is expressed by an average value of distance wherein an ion flies in a straight line without colliding with any gas molecule (i.e. mean free path). It is evident that the mean free path decreases as the gas pressure rises. If the mean free path is shorter than the distance of the ion beam 15 from the tip end of the emitter tip 11 to a target sample, the ion beam 15 becomes difficult to converge due to an effect of the above scattering. That is, even if there is no risk of electric discharge, instead, there will be an upper limit for the pressure in the introduced ionization gas due to the effect of the scattering.

Some conventional gas field ionization sources have a construction for reducing the effect of the above scattering by heightening the vacuum in the path of the ion beam by using differential pumping wherein evacuation is constructed in multi-stage. Specifically, a highly airtight container enclosing the emitter tip and the extraction electrode is used for sealing, the ionization gas is introduced therein, the ionization gas is evacuated only from an extraction electrode hole so that the ionization gas pressure is higher only around the emitter tip, thereby the effect of the above scattering problem would be reduced.

Such differential pumping can also be employed in the present embodiment. The differential pumping can for example be realized by providing a vacuum partition 12 around the emitter tip 11.

Figure 3:
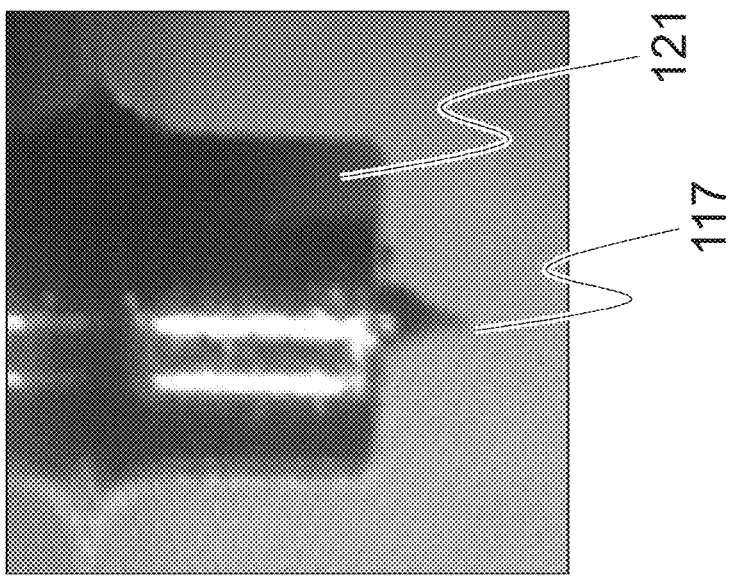
FIG. 3 is a photograph explaining a construction of a vacuum partition of FIG. 1.
Figure 2:
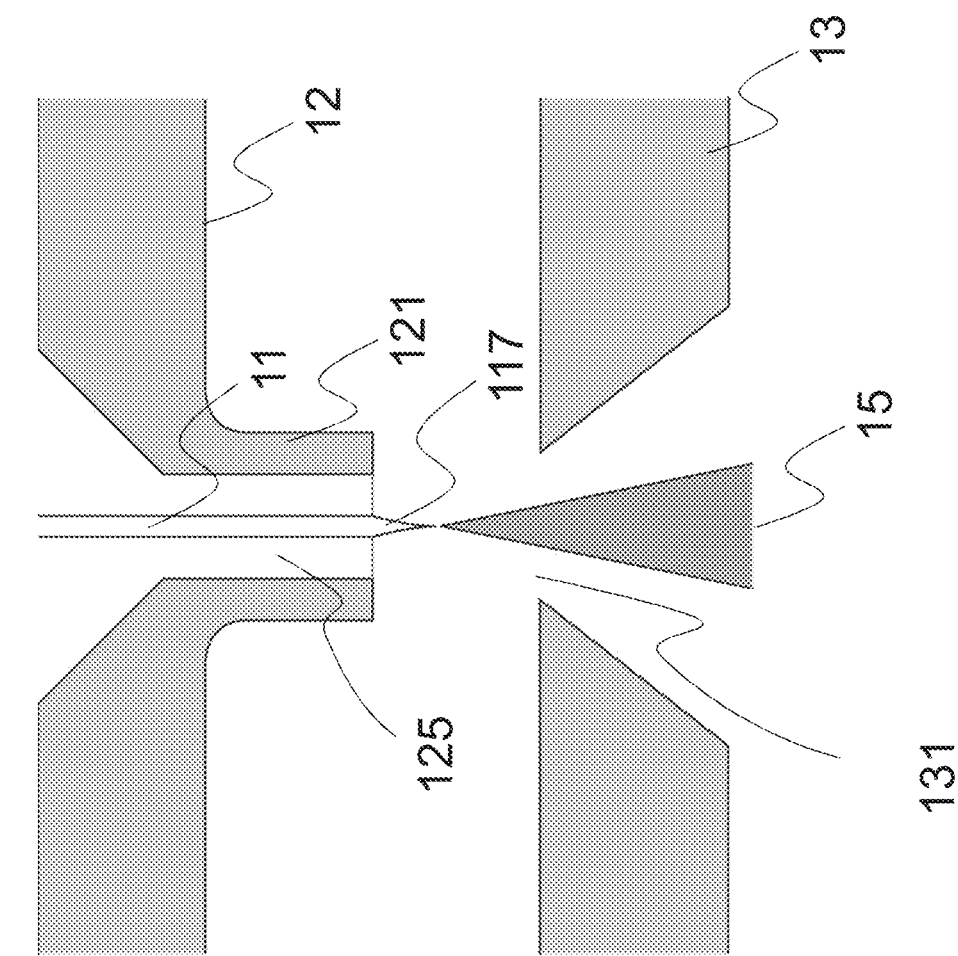
FIG. 2 is a schematic cross section explaining a construction of a vacuum partition of FIG. 1.

A construction of the vacuum partition 12 will be explained using FIGS. 2 and 3. FIG. 2 is a schematic cross section and FIG. 3 is a photograph of a portion of FIG. 2 taken in a direction approximately same as FIG. 2. The vacuum partition 12 is made of a metal (or is electrically conductive). The vacuum partition 12 is not an airtight partition which maintains the vacuum strictly but has a hole 125 whereby an air pressure difference can be maintained stationary if the ionization gas is supplied at a constant flow rate. The hole 125 is constructed so that the tip end of the emitter tip 11 (or a portion of a specific length including the tip end) can pass therethrough. In the example of FIG. 2, an internal diameter of the hole 125 is greater than an external diameter of the emitter tip 11 (more precisely, an external diameter of a portion of a specific length including, or in the vicinity of, the tip end of the emitter tip 11) so that the emitter tip 11 can pass therethrough.

The emitter tip 11 is placed passing through the hole 125 so that the base side is at the high-pressure side, i.e. the side of the flow rate adjusting means 32, and the tip end side is at the low-pressure side, i.e. the side of the extraction electrode 13, with respect to the vacuum partition 12. As indicated by the reference numeral 117 in FIG. 2, the tip end of the emitter tip 11 protrudes from the hole 125 of the vacuum partition 12 toward the side of the extraction electrode 13. The vacuum partition 12 allows raising the pressure at the tip end of the emitter tip 11 locally.

Here, if the vacuum partition 12 were formed of a dielectric material, it might be possible to further raise an electric field strength around the tip end so that more complete ionization would be performed. However, the dielectric material around the emitter tip 11 would be charged so that the electric field strength would be unstable. On the other hand, if the vacuum partition 12 is formed of a metal or an electrically conductive material as in the present embodiment, the electric field is shielded so that it would be difficult to form a sufficient electric field strength in the vicinity of the tip end of the emitter tip 11 depending on the shape of the vacuum partition 12.

Accordingly, in the present embodiment, a micro protrusion 121 is provided at the vacuum partition 12 in order to suppress an effect of shielding the electric field. The micro protrusion 121 is an example of a convex structure protruding toward the side of the extraction electrode 13 around the hole 125 of the vacuum partition 12. Note that, as shown in FIG. 2, the tip end of the emitter tip 11 protrudes further toward the side of the extraction electrode 13 from an end of the micro protrusion 121.

Thus, the emitter tip 11 protrudes (reference numeral 117) from the hole 125 of the vacuum partition 12 through the micro protrusion 121 toward the side of the extraction electrode 13, so the electric field around the tip end of the emitter tip 11 is not shielded very strictly, so the electric field formed at the tip end of the emitter tip 11 will be stronger and an electric field strength sufficient to ionize the ionization gas can be generated easily.

A shape of the micro protrusion 121 may be constructed in a cylindrical shape wherein the axial direction is a direction in which the ion beam 15 is emitted. Also, the micro protrusion 121 may be formed to surround the emitter tip 11 at around the hole 125 of the vacuum partition 12.

Figure 4:
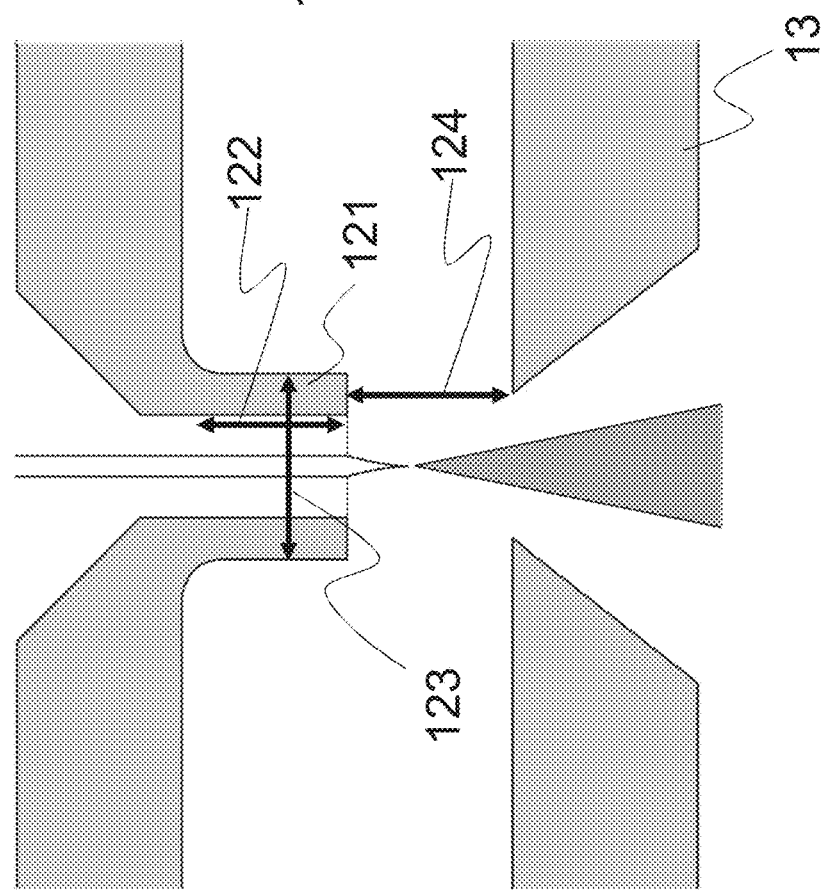
FIG. 4 is a diagram showing dimensions related to a micro protrusion of FIG. 1.

FIG. 4 shows dimensions related to the micro protrusion 121. The dimensions of the micro protrusion 121 may be designed in any manner, but for example can be constructed so that a ratio of an external diameter 123 of the micro protrusion 121 (the diameter, if an external shape of the micro protrusion 121 is a cylindrical shape) to a height 122 of the micro protrusion 121 (i.e. an axial length) (that is, the ratio is a value of the external diameter 123/the height 122) is equal to or less than 1.22. Such a value can realize a better balance between the ionization gas pressure and the electric field strength.

As specific ranges for the dimensions in the shape, the height 122 of the micro protrusion 121 can be equal to or more than 0.5 mm and the external diameter 123 of the micro protrusion 121 can be equal to or less than 0.61 mm. Also, in this case, an internal diameter of the hole 125 of the micro protrusion 121 (the diameter, if an internal shape of the micro protrusion 121 is a cylindrical shape) may be equal to or less than 0.21 mm.

Also, a distance 124 between the micro protrusion 121 and the extraction electrode 13 may for example be equal to or less than 1.5 mm. By reducing the distance 124, the electric field strength around the emitter tip 11 can be maintained in a high value.

Figure 5:
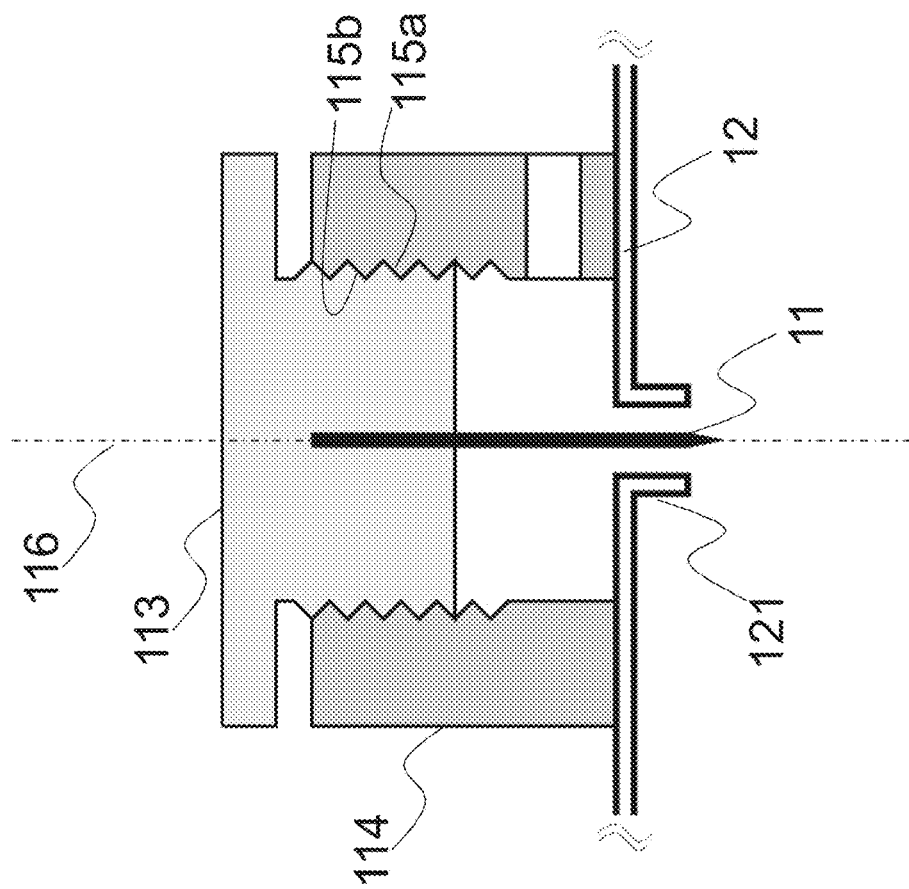
FIG. 5 is a diagram showing a construction for supporting an emitter tip of FIG. 1.

FIG. 5 shows a construction for supporting the emitter tip 11. The gas field ionization source 1 related to the present embodiment comprises an adjusting mechanism for adjusting relative positional relationship between the emitter tip 11 and the hole 125 of the vacuum partition 12 (e.g. a positional relationship in an axial direction). In the example of FIG. 5, the adjusting mechanism comprises an emitter tip supporting component 113 and an emitter tip positioning component 114.

The emitter tip supporting component 113 fixes and supports the emitter tip 11. Also, the emitter tip supporting component 113 is supported by the emitter tip positioning component 114. The emitter tip positioning component 114 is fixed to the vacuum partition 12 and its positional relationship with respect to the hole 125 is also fixed. The emitter tip positioning component 114 comprises a function for adjusting relative positional relationship between the emitter tip 11 and the hole 125 of the vacuum partition 12 freely by adjusting its own relative positional relationship with respect to the emitter tip supporting component 113.

In the example of FIG. 5, adjustment of the positional relationship is realized by a screw mechanism. That is, a screw channel 115a is formed on an external circumference of the emitter tip supporting component 113 and a corresponding screw channel 115b is formed on in internal circumference of the emitter tip positioning component 114. The emitter tip 11 moves in an axial direction with respect to the hole 125 when the emitter tip supporting component 113 and the emitter tip positioning component 114 fit and move in rotation with respect to each other along respective screw channels 115a and 115b.

Such a construction allows easy adjustment of the distance between the emitter tip 11 and the extraction electrode 13 (or a center of the extraction electrode hole 131) merely by rotating the emitter tip supporting component 113 along the screw channels 115a and 115b. By using such an adjusting mechanism, the position of the emitter tip 11 (in particular, the position of the tip end) can be adjusted, so a better balance can be realized between pressure distribution of the ionization gas and the electric field at the tip end of the emitter tip 11. Also, by realizing the adjusting mechanism using in particular the screw channels, the construction of the adjusting mechanism can be comparatively simple.

It may be constructed so that a rotation axis 116 of the screw channel 115a passes through the hole 125 of the vacuum partition 12. Also, it may be constructed so that the rotation axis 116 of the screw channel 115a is aligned with an axis of the emitter tip 11. In this construction, a lateral position (i.e. a position in a direction perpendicular to the axis) of the emitter tip 11 can be fixed beforehand, so positioning operation upon use can be performed comparatively easily.

The adjustment of the positional relationship may be realized by a different mechanism. For example, a mechanism for moving the emitter tip 11 in directions of up, down, left and right may be comprised so that the axis of the emitter tip 11 and the center of the extraction electrode hole 131 are aligned. Also, these adjusting mechanisms may be omitted.

Referring back to FIG. 1, the gas field ionization source 1 may comprise a vacuum gauge 18 for measuring a degree of vacuum in the vacuum chamber 17. The gas pressure can be adjusted by adjusting e.g. the flow rate adjusting means 32 automatically or manually in response to the measured degree of vacuum. Appropriate adjustment of the gas pressure reduces a ratio of the ion beam 15 being scattered by the ionization gas. For example, a gas pressure in a region in a lower-pressure side with respect to the vacuum partition 12 in the vacuum chamber 17 can be adjusted to be a degree of vacuum equal to or higher than 0.1 Pa (i.e. a gas pressure of less than 0.1 Pa).

Also, the degree of vacuum around the emitter tip 11 can be obtained indirectly by monitoring the vacuum gauge 18. Control of the gas pressure is very important because amount of electric current emitted from the gas field ionization source 1 is proportional to the gas pressure around the emitter tip 11. The flow rate adjusting means 32 may be adjusted so that the gas pressure in the vacuum chamber 17 is constant, or that fluctuation of the gas pressure in the vacuum chamber 17 is suppressed, in response to the degree of vacuum measured by the vacuum gauge 18.

If amount of the gas used is particularly large, the gas stored in the gas supply means 31 decreases as the time passes, so the gas pressure of the ionization gas supplied to the emitter tip 11 will eventually drop if a conductance of the flow rate adjusting means 32 is constant. Such a phenomenon can be prevented by adjusting the flow rate adjusting means 32 in response to the degree of vacuum as described above.

By constructing the above gas field ionization source 1, an effect of raising the gas pressure of the ionization gas locally around the emitter tip 11 is obtained. Accordingly, a sufficient intensity can be maintained for the ion beam 15 without cooling the emitter tip 11 or with cooling weaker than conventional constructions.

Also, the voltage required to generate an electric field sufficient for ionizing the ionization gas at the tip end of the emitter tip 11 (i.e. the electric potential difference between the emitter tip 11 and the extraction electrode 13) can be an electric potential difference of a fully practical scale (e.g. equal to or less than 30 kV).

Further, it is constructed so that the gas supply means 31 is electrically connected to the emitter tip 11 or have an electrical potential equal to the emitter tip 11, so there is no risk of electric discharge via the ionization gas even if the gas pressure is raised.

In addition, the adjusting mechanism for adjusting the relative position between the emitter tip 11 and the hole 125 of the vacuum partition 12 is comprised, so the relationship between the pressure distribution of the ionization gas and the electric field of the tip end of the emitter tip 11 can be adjusted to be optimal.

In conventional techniques, the tip end of the emitter tip may need to be sharpened to a range of about one to three atoms. Although many methods have been proposed for sharpening to the atomic level, there are problems that they are technically difficult and monetary cost is high. Also, some methods have a problem that steps for sharpening require time. In contrast, according to the present embodiment, a sufficient ion beam intensity can be obtained comparatively easily, so the tip end of the emitter tip 11 does not have to be sharpened to the atomic level. However, it is also possible to enhance performance further by sharpening.

Figure 6B:
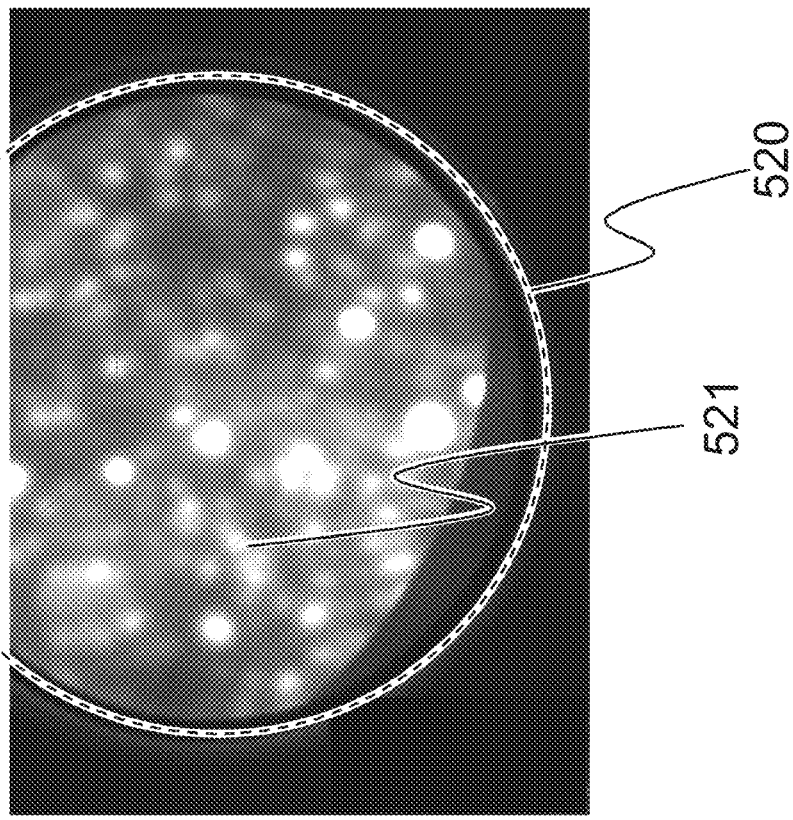
FIGS. 6A and 6B are diagrams showing an effect of an experiment example according to an experimental example of the present invention.
Figure 6A:
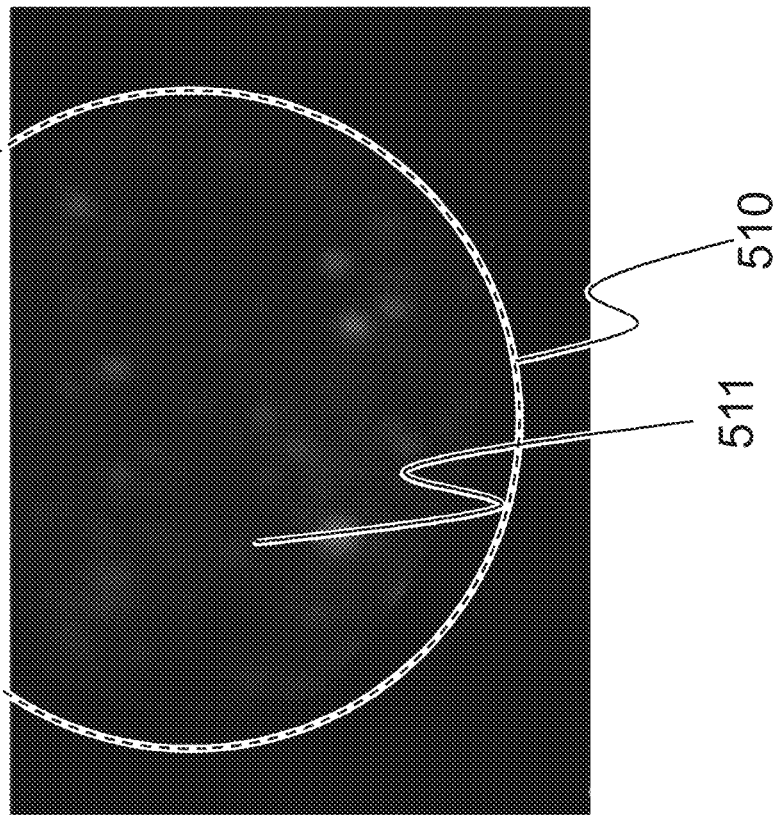

FIGS. 6A and 6B show an effect of an experimental example of the present invention. The inventor confirmed an effect of the gas field ionization source 1 related to the first embodiment by actually creating a gas field ionization source comprising a construction equivalent to the first embodiment and performing an experiment for generating the ion beam.

FIG. 6A shows an evaluation result of ionization according to a comparative example, i.e. a conventional gas field ionization source. In the conventional construction, the image representing the result detected by a detection plane 510 of the micro channel plate for detecting ions is dark, indicating that the amount of ion emission 511 from sample atoms is small.

FIG. 6B shows an evaluation result of ionization according to a gas field ionization source related to the present experiment. In this construction, the image representing the result detected by a detection plane 520 of the micro channel plate 5 (FIG. 1) for detecting ions is bright, indicating that the amount of ion emission 521 from sample atoms is large.

Regarding the above two evaluations, detection conditions for the micro channel plates are equivalent and the degrees of vacuum measured by the vacuum gauge are also equivalent (and therefore the degrees of vacuum in the paths that ion beams pass are also equivalent). In other words, it can be said that the degrees that the ion beams are scattered are similar for the two results. However, there is a difference in the amounts of ion emission from the samples, which means that the present experiment example increased the electric current of the ion beam 15 by enhancing the gas pressure only around the emitter tip 11. According to the detected brightness in the micro channel plate, the ion current related to the present experiment example is increased to 7 to 20 times compared with the conventional ion current.

Comparison between the gas field ionization source related to the first embodiment and a conventional gas field ionization source is further described below. In JP 2016-76431A, in order to increase an intensity of the ion beam, an external electrode is placed outside a container filled with ionization gas, electric potentials of a needle-shaped electrode and an aperture electrode around a micro aperture provided at the container to be equal, and the gas is ionized by applying a strong electric field at the tip end of the needle-shaped electrode by an electric potential difference between the needle-shaped electrode, the aperture electrode and the external electrode. It states that the gas is ionized effectively by utilizing a steep pressure gradient generated by the ionization gas ejecting from the micro aperture and that probability of collision between the ions and the gas is maintained low. Also, it states that this structure eliminates the need for cooling and allows effective ionization with a simple structure.

However, the method of JP 2016-76431A has a problem that it is difficult to generate an electric field at the tip end of the needle-shaped electrode because there is the aperture electrode between the needle-shaped electrode and the external electrode, so a very high voltage is applied between the needle-shaped electrode and the external electrode. Also, the pressure gradient generated around an outside of the aperture electrode is so steep that it is very difficult to find an optimal relationship between the gas introduction condition for enhancing ion source intensity and the position of the needle-shaped electrode. Further, while it is indispensable to introduce the ionization gas into the container at as high a pressure as possible, the introduction gas pressure has an upper limit because the ionization gas causes electric discharge due to the electric potential difference between the container at a high voltage and a gas introduction source (e.g. high pressure gas cylinder) at the ground potential. The problem would be even more difficult considering that the voltage applied between the needle-shaped electrode and the external electrode is high.

In order to solve the above problem that it is difficult to generate an electric field at the tip end of the needle-shaped electrode, JP 2013-8471A uses the container made of a high dielectric material instead of a metal in order to generate the electric field between the high dielectric material and the external electrode easily. Also, it states that, with further forming a surface of the high dielectric material in the vicinity of the needle-shaped electrode with a material that suppresses occurrence of secondary electrons, a stable and high-intensity ion beam can be generated continuously for a long period without degradation or instability in the electric field strength in the vicinity of the tip and of the needle-shaped electrode.

However, in the method of JP 2013-8471A, the high-dielectric material is in the vicinity of the needle-shaped electrode, so the electric field at the needle-shaped electrode cannot be controlled from outside. Although degradation and instability in the electric field strength in the vicinity of the tip end may be suppressed in a stationary state, this is not the case if e.g. the emitted ion beam current is changed, and there arises a problem that re-adjustment is required for the external electrode or optical elements such as an electric field lens in order to maintain convergence performance for the ion beam. Also, there is a problem that it takes time until the stationary state is reached again. Further, there still are problems regarding the upper limit for the high gas pressure due to electric discharge or optimization of the condition for gas introduction and the position of the needle-shaped electrode.

According to the gas field ionization source 1 related to the first embodiment of the present invention, the problems described above regarding JP 2016-76431A and JP 2013-8471A can be avoided while making cooling of the emitter tip 11 unnecessary.

Following modifications can be made to the above first embodiment. The ionization gas stored in the gas supply means 31 may be supplied after gas purification by using a gas filter or the like if necessary. The gas filter may be provided before or after the gas supply means 31 or both.

It can be constructed that an inside of the vacuum chamber 17 of the gas field ionization source 1 is maintained at an ultrahigh vacuum of equal to or less than $10^{-7}$ Pa provided that there is no gas introduction by the flow rate adjusting means 37. In order for the inside of the vacuum chamber 17 to reach the ultrahigh vacuum, a startup operation of the gas field ionization source 1 may include a process for heating the entire vacuum chamber 17 to a temperature equal to or higher than 100 degrees (referred to as "baking").

If the gas is introduced from the gas supply means 31 to an entire inside of the vacuum chamber 17 at an excessively high gas pressure, there will be a state wherein the gas pressure is high in an entire optical path of the ion beam 15 emitted from the emitter tip 11, leading to deficiency, e.g. a portion of the ion beam 15 is scattered and beam convergence is deteriorated. In order to control this appropriately, it is preferable that the gas pressure introduced into the vacuum chamber 17 is around about 0.01 Pa.

Also, the pressure of the ionization gas around the emitter tip 11 can be equal to or higher than 1 Pa.

The tip end of the emitter tip 11 may be sharpened. For example, a method including heating of the emitter tip 11 may be employed in order to terminate it with equal to or less than three atoms, preferably with a single atom. Also, a method that introduces a gas such as $O_2$ or $N_2$ into the vacuum chamber 17 during heating the emitter tip 11 may be employed in order to sharpen the tip end of the emitter tip 11 in a similar manner. Further, a method that introduces a gas such as $O_2$ or $N_2$ into the vacuum chamber 17 during applying a high voltage between the emitter tip 11 and the extraction electrode 13 may be employed in order to sharpen the tip end of the emitter tip 11 in a similar manner. Further, a method that constructs the emitter tip 11 with a needle including tungsten as a primary component, evaporates a noble metal (e.g. iridium, palladium, platinum, etc.) on a surface thereof and heats the emitter tip 11 in a similar manner.

Note that, although the present invention makes cooling of the emitter tip 11 unnecessary or makes it operable with cooling weaker than conventional, it does not exclude any construction wherein the emitter tip 11 is cooled to a degree similar to a conventional construction. The electric current of the ion beam 15 can be increased by cooling the emitter tip 11 if disadvantages of cooling (additional cost or labor, or the like) can be tolerated in accordance with applications or the like of the ion beam.

Second Embodiment

A second embodiment alters a construction for supplying the ionization gas in the first embodiment. Hereinafter differences with the first embodiment will be described.

Figure 7:
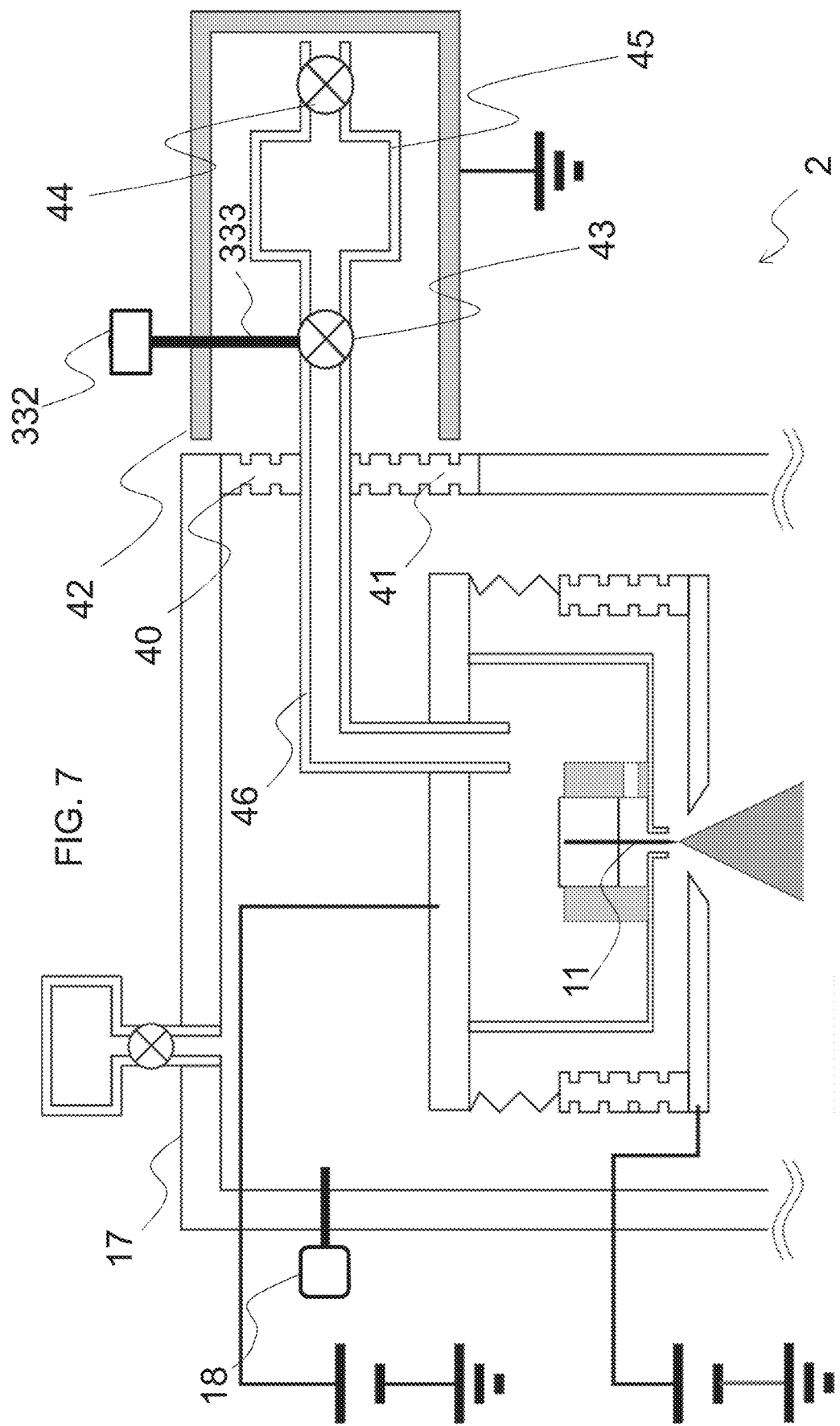
FIG. 7 is a diagram showing a construction of a gas field ionization source related to a second embodiment of the present invention.

FIG. 7 shows a construction of a gas field ionization source 2 related to the second embodiment. The gas field ionization source 2 comprises a gas supply means 45 instead of the gas supply means 31 and the gas cylinder 35 related to the first embodiment. Also, the gas field ionization source 2 comprises a flow rate adjusting means 43 instead of the flow rate adjusting means 32, the valve 33 and the flow rate adjusting means 37 related to the first embodiment. The gas supply means 45 is not contained in the vacuum chamber 17. Accordingly, the ionization gas can be supplied in a single-stage construction, not in the two-stage construction as in the first embodiment, so the construction is comparatively simple.

The gas introduction tube 46 connects the gas supply means 45 and a space in the vicinity of the emitter tip 11. Electric potentials of the gas supply means 45 and the emitter tip 11 can be maintained to be equal by constructing the gas introduction tube 46 from a metal (or an electrically conductive material).

If the gas field ionization source 2 is operated, a high voltage is applied to the gas supply means 45, so the gas supply means 45 may be covered by a cover 42 made of a metal (or an electrically conductive material) for safety. In other words, the gas supply means 45 may be contained in the cover 42. Note that "contain" here does not require that all directions are covered completely. In the example of FIG. 7, a portion of periphery of the gas supply means 45 is covered by the vacuum chamber 17, an insulator 40 or an insulator 41 and another portion thereof is covered by the cover 42.

The cover 42 may be connected electrically to the vacuum chamber 17 or grounded. An inside of the cover 42 may be a vacuum (e.g. of a degree similar to the vacuum chamber 17) or filled with a gas which hardly discharges electrically (e.g. $PF_6$). Also, although FIG. 7 shows for clarity that there are gaps between the vacuum chamber 17, the insulator 40 and 41 and the cover 42, they may be joined with an airtightness practically sufficient.

The ionization gas is introduced from the gas supply means 45 to the vicinity of the emitter tip 11 via the flow rate adjusting means 43. The electric potential of the flow rate adjusting means 43 will be equal to that of the emitter tip 11, so a ground-side adjusting mechanism 332 may be provided in order to adjust the flow rate adjusting means 43. The ground-side adjusting mechanism 332 and the flow rate adjusting means 43 are connected by the connection mechanism 333.

The connection mechanism 333 may be a power transmission mechanism or an information transmission means. If the connection mechanism 333 is a power transmission mechanism, it can be constructed by an electrically insulating member. If the connection mechanism 333 is an information transmission means, it can be constructed to communicate an instruction issued from the ground-side adjusting mechanism 332 to the flow rate adjusting means 43 in a remote manner by using an electric wave or the like.

The gas supply means 45 may be constructed by a small gas cylinder. Also, the gas supply means 45 may be provided with a sealing valve 44 and may be constructed so that a gas cylinder for charging can be connected from the outside via the sealing valve 44. In this construction, if the gas pressure within the gas supply means 45 drops by usage of the ion source, the ionization gas can be charged newly into the gas supply means 45 by removing the cover 42 and connecting the gas cylinder. After charging, the gas field ionization source 2 can be used continuously by disconnecting the charging gas cylinder and covering it with the cover 42 again.

DESCRIPTION OF SYMBOLS 1, 2 Gas field ionization source
5 Micro channel plate
11 Emitter tip
12 Vacuum partition
13 Extraction electrode
15 Ion beam
16 Evacuation means
17 Vacuum chamber (vacuum container)
18 Vacuum gauge
19 Bellows
31 Gas supply means
32 Flow rate adjusting means
33 Valve
34 Vacuum pump
35 Gas cylinder (additional gas supply means)
36 Valve
37 Flow rate adjusting means
38 Insulation tube
40,41 Insulator
42 Cover
43 Flow rate adjusting means
44 Sealing valve
45 Gas supply means
46 Gas introduction tube
111,112 High voltage power source (means for applying voltage)
113 Emitter tip supporting component (adjusting mechanism)
114 Emitter tip positioning component (adjusting mechanism)
115a,115b Screw channel
116 Rotation axis
117 Protrusion of emitter tip
121 Micro protrusion (convex structure)
122 Height of micro protrusion
123 External diameter of micro protrusion
124 Distance between micro protrusion and extraction electrode
125 Hole of vacuum partition
131 Extraction electrode hole
132 Insulator
330 Atmosphere-side adjusting mechanism
331,333 Connection mechanism
332 Ground-side adjusting mechanism
510,520 Detection plane of micro channel plate
511,521 Ion emission from atoms

What is claimed is:

1. A gas field ionization source for forming an electric field for ionizing gas, comprising:
   an emitter tip having a tip end;
   an extraction electrode facing the emitter tip and having an aperture at a position distant therefrom;
   a gas supplier for supplying the gas in the vicinity of the emitter tip;
   a vacuum partition made of a metal having a hole, the hole being constructed so that the tip end of the emitter tip can pass therethrough; and
   a voltage applier for applying voltage between the emitter tip and the extraction electrode,
   wherein the vacuum partition has a convex structure, around the hole, comprising a micropartition protruding toward a side of the extraction electrode in an axial direction in which an ion beam is emitted.

2. The gas field ionization source according to claim 1, constructed so that the gas supplier is electrically connected to the emitter tip or an electric potential thereof is equal to that of the emitter tip.

3. The gas field ionization source according to claim 2, comprising:
   an additional gas supplier for supplying the gas to the gas supplier;
   an insulation tube for connecting the gas supplier and the additional gas supplier; and
   an evacuator for evacuating an inside of the insulation tube.

4. The gas field ionization source according to claim 2, wherein:
   the gas field ionization source comprises a vacuum container containing the emitter tip, the extraction electrode and the vacuum partition;
   the gas field ionization source is constructed so that the gas supplier is electrically connected to the emitter tip or an electric potential thereof is equal to that of the emitter tip; and
   the gas supplier is not contained in the vacuum container.

5. The gas field ionization source according to claim 4, wherein:
   the gas supplier is contained in a cover made of a metal; and
   the cover is electrically connected to the vacuum container or is grounded.

6. The gas field ionization source according to claim 1, comprising an adjustor for adjusting a relative positional relationship between the emitter tip and the hole of the vacuum partition.

7. The gas field ionization source according to claim 6, wherein:
   the adjustor comprises a supporter for supporting the emitter tip; and
   a screw channel is formed on the supporter.

8. The gas field ionization source according to claim 7, wherein an axis of the screw channel passes through the hole of the vacuum partition.

9. The gas field ionization source according to claim 1, wherein:
   an external shape of the convex structure is a cylindrical shape; and
   a ratio of an external diameter of the convex structure to an axial length thereof is equal to or less than 1.22.

10. The gas field ionization source according to claim 1, wherein a distance between the convex structure and the extraction electrode is equal to or less than 1.5 mm.

* * * * *